(12) United States Patent
Zusho et al.

(10) Patent No.: US 11,837,815 B2
(45) Date of Patent: Dec. 5, 2023

(54) SEALING MEMBER BETWEEN A CABLE AND CONNECTOR OPENING IN AN ELECTRONIC DEVICE

(71) Applicant: Panasonic Intellectual Property Management Co., Ltd., Osaka (JP)

(72) Inventors: Kazuki Zusho, Osaka (JP); Shinji Fujita, Osaka (JP); Hiroki Kamezaki, Osaka (JP); Hitoshi Nakatani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 108 days.

(21) Appl. No.: 17/542,372

(22) Filed: Dec. 4, 2021

(65) Prior Publication Data

US 2022/0094100 A1 Mar. 24, 2022

Related U.S. Application Data

(63) Continuation of application No. PCT/JP2020/022223, filed on Jun. 5, 2020.

(30) Foreign Application Priority Data

Jun. 13, 2019 (JP) .................................. 2019-110487

(51) Int. Cl.
 *H01R 13/52* (2006.01)
(52) U.S. Cl.
 CPC ................................ *H01R 13/5205* (2013.01)
(58) Field of Classification Search
 CPC ........................... H01R 13/5205; H02G 15/013
 See application file for complete search history.

(56) References Cited

U.S. PATENT DOCUMENTS

| 5,545,048 A | 8/1996 | Maeda |
| 7,736,165 B2 * | 6/2010 | Bukovnik .......... H01R 13/5216 439/936 |

(Continued)

FOREIGN PATENT DOCUMENTS

| JP | 02890234 B2 | 2/1999 |
| JP | 05369586 B2 | 4/2010 |

(Continued)

OTHER PUBLICATIONS

International Search Report for related Application No. PCT/JP2020/022223, dated Jul. 28, 2020.

*Primary Examiner* — Vanessa Girardi
(74) *Attorney, Agent, or Firm* — Renner, Otto, Boisselle & Sklar, LLP

(57) ABSTRACT

A sealing member is attached to a connector opening of an electronic device to seal between an insulating cover of a cable inserted in the connector opening and a main body of the electronic device. The sealing member includes a housing made of an elastic material. The housing includes a first opening, a second opening facing the first opening and located to an inside of the electronic device than the first opening, and an inclined surface having a tapered shape that is tapered inward from the first opening to the second opening. The housing includes a first cylindrical portion forming the inclined surface inside the first cylindrical portion, a second cylindrical portion provided outside the first cylindrical portion, and a gap formed between the first cylindrical portion and the second cylindrical portion. The first cylindrical portion and the second cylindrical portion are connected to each other around the first opening.

9 Claims, 11 Drawing Sheets

(56) References Cited

U.S. PATENT DOCUMENTS

| | | |
|---|---|---|
| 2009/0023321 A1 | 1/2009 | Bukovnik |
| 2013/0099452 A1 | 4/2013 | Hein |
| 2018/0248303 A1 | 8/2018 | Masui |

FOREIGN PATENT DOCUMENTS

| | | |
|---|---|---|
| JP | 2010-533956 A | 10/2010 |
| JP | 2012-114502 A | 6/2012 |
| JP | 2013-531332 A | 8/2013 |
| JP | 2017-103116 A | 6/2017 |
| JP | 2018-120960 A | 8/2018 |
| WO | 2009011812 A2 | 1/2009 |
| WO | 2011138182 A1 | 11/2011 |

* cited by examiner

SEALING MEMBER BETWEEN A CABLE AND CONNECTOR OPENING IN AN ELECTRONIC DEVICE

BACKGROUND

1. Technical Field

The present invention relates to a sealing member and an electronic device having the sealing member.

2. Description of the Related Art

Conventionally, in an electronic device such as a laptop computer, there has been proposed a structure in which a sealing member made of an elastic material is attached to a connector opening for cable connection to seal between a cable inserted in the connector opening and an electronic device body (for example, see patent literature (PTL) 1).

PTL 1 is Unexamined Japanese Patent Publication No. 2018-120960.

SUMMARY

Although the sealing member can seal between the cable and the electronic device body, the presence of the sealing member may impede insertion of the cable, so that insertability is impaired. It can be said that there is still room for improvement in accurately sealing between the cable and the electronic device body while enabling the cable to be easily inserted.

Therefore, an object of the present invention is to solve the above problem and to provide a sealing member capable of accurately sealing between a cable and an electronic device body while allowing the cable to be easily inserted, and to provide an electronic device including the sealing member.

To achieve the above object, a sealing member of the present invention is attached to a connector opening of an electronic device to seal between an insulating cover of a cable inserted in the connector opening and a main body of the electronic device. The sealing member includes a housing made of an elastic material. The housing includes a first opening, a second opening facing the first opening and located to an inside of the electronic device than the first opening, and an inclined surface having a tapered shape that is tapered inward from the first opening to the second opening. The housing includes an inner wall portion forming the inclined surface inside the inner wall portion, an outer wall portion provided outside the inner wall portion, and a gap formed between the inner wall portion and the outer wall portion. The inner wall portion and the outer wall portion are connected to each other around the first opening.

An electronic device of the present invention includes the connector opening and the sealing member attached to the connector opening.

The sealing member and the electronic device including the same of the present invention make it possible to accurately seal between the cable and a body of the electronic device while allowing the cable to be easily inserted.

DETAILED DESCRIPTION

Figure 1:
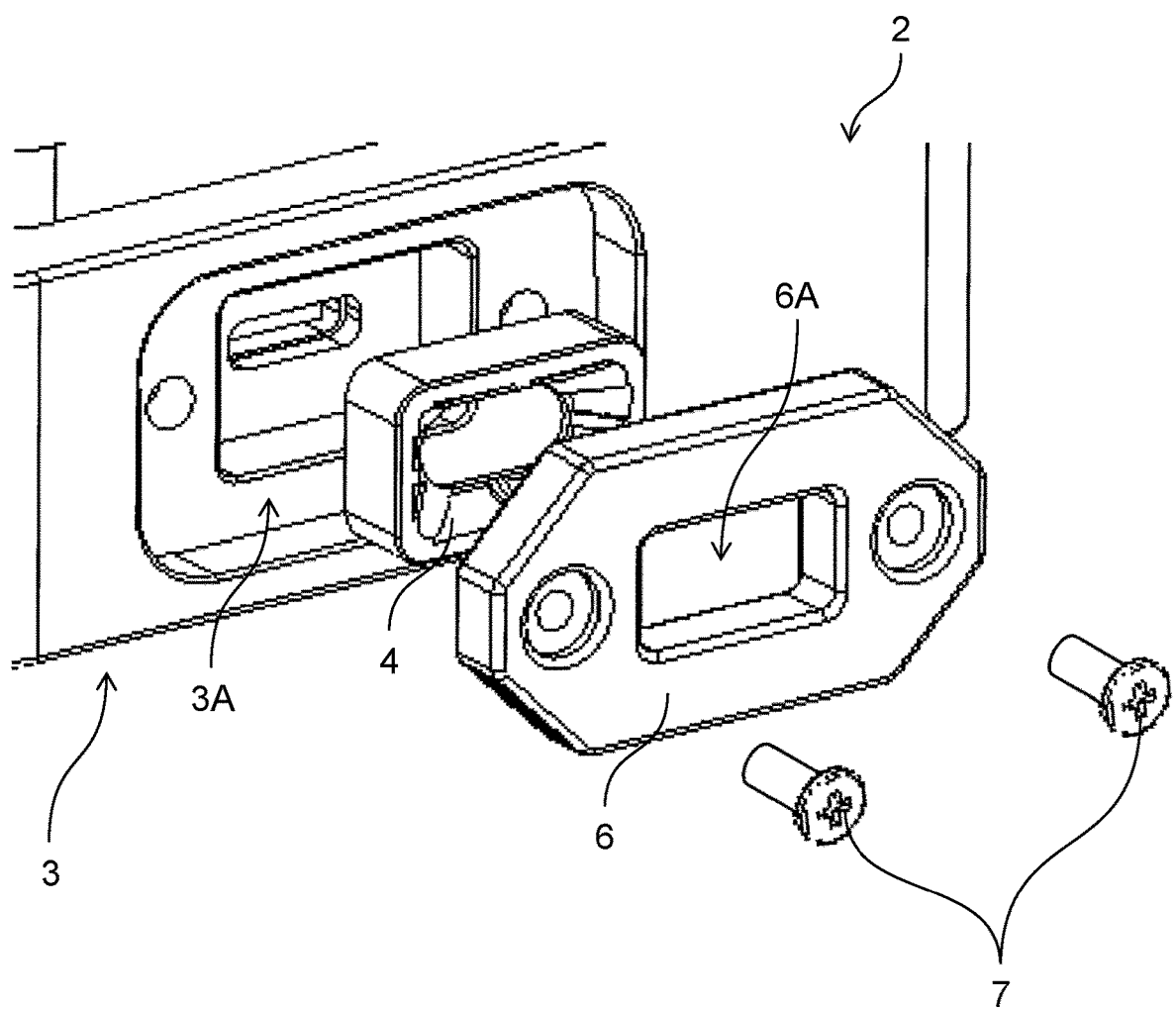
FIG. 1 is an exploded perspective view around a connector opening and a sealing member in an electronic device of an exemplary embodiment.

A first aspect of the present invention provides a sealing member attached to a connector opening of an electronic device to seal between an insulating cover of a cable inserted in the connector opening and a main body of the electronic device. The sealing member includes: a housing made of an elastic material. The housing including a first opening, a second opening facing the first opening and located to an inside of the electronic device than the first opening, and an inclined surface having a tapered shape that is tapered inward from the first opening to the second opening. The housing includes an inner wall portion forming the inclined surface inside the inner wall portion, an outer wall portion provided outside the inner wall portion, and a gap formed between the inner wall portion and the outer wall portion. The inner wall portion and the outer wall portion are connected to each other around the first opening.

With such a configuration, by inserting the cable from the first opening and by inserting the insulating cover of the cable toward the second opening while bringing the insulating cover of the cable into contact with the inclined surface of the inner wall portion, a space between the insulating cover of the cable and the electronic device body can be sealed by the housing. Since the gap is provided between the inner wall portion and the outer wall portion, even when the inner wall portion is pushed outward by the inserted cable, a space in which the inner wall portion is deformed can be secured, and the insertion of the cable can be prevented from being hindered. In this way, it is possible to accurately seal between the cable and the electronic device body while allowing the cable to be easily inserted.

A second aspect of the present invention provides the sealing member according to the first aspect, wherein the inclined surface of the housing is provided with at least one rib extending along a cable insertion direction that is a direction from the first opening toward the second opening.

With such a configuration, movement of the cable inserted from the first opening can be guided by the rib, and, in addition, the strength of the housing can be reinforced.

A third aspect of the present invention provides sealing member according to the second aspect, wherein the inclined surface of the housing has a corner portion extending along the cable insertion direction, and the at least one rib includes a first rib provided upright at the corner portion of the inclined surface.

Such a configuration makes it possible to reinforce, by the rib, the corner portion of the inclined surface where a stress tends to concentrate.

A fourth aspect of the present invention provides the sealing member according to the second aspect, wherein the inclined surface of the housing has a corner portion extending along the cable insertion direction, and the at least one rib includes a second rib provided upright at a position different from the corner portion of the inclined surface.

Such a configuration can perform positioning of the cable inserted from the first opening.

A fifth aspect of the present invention provides the sealing member according to the second aspect, wherein the inclined surface of the housing has a corner portion extending along the cable insertion direction, the at least one rib includes a plurality of ribs, each of the plurality of ribs includes: a first rib provided upright at the corner portion of the inclined surface; and a second rib provided upright at a position different from the corner portion of the inclined surface, and a thickness of the second rib is larger than a thickness of the first rib at the first opening.

Such a configuration can perform positioning of the cable inserted from the first opening, by the second rib. Further, by making the thickness of the second rib at the first opening larger than the thickness of the first rib, a positioning effect to the cable by the second rib can be preferentially exerted.

A sixth aspect of the present invention provides the sealing member according to any one of the second to fifth aspects, wherein the inclined surface of the housing includes a protruding portion extending to annularly surround a cable insertion direction that is a direction from the first opening toward the second opening, and the protruding portion is provided flush with the at least one rib.

With such a configuration, sealing is performed by bringing the cable inserted from the first opening in contact with the protruding portion, and, at the same time, the cable is more reliably sealed by providing the protruding portion flush with the rib.

A seventh aspect of the present invention provides the sealing member according to the sixth aspect, wherein the protruding portion constitutes the second opening.

With such a configuration, since the protruding portion is provided around the second opening, which is narrowest, the cable can be strongly pressed against the protruding portion, and the cable can therefore be more reliably sealed.

An eighth aspect of the present invention provides the sealing member according to any one of the first to seventh aspects, wherein the outer wall portion is disposed to extend to the inside of the electronic device than the inner wall portion.

With such a configuration, even when the cable is inserted from the first opening and the inner wall portion is pushed toward the back side by the cable, a space in which the inner wall portion is deformed can be secured, and the insertion of the cable can be prevented from being hindered.

A ninth aspect of the present invention provides the sealing member according to any one of the first to eighth aspects, wherein the outer wall portion has: a first surface that is a surface directed to an outside of the electronic device and is continuous with the inner wall portion around the first opening: and a second surface that is directed to the inside of the electronic device at a position facing the first surface, and the housing is fixed to the connector opening with the second surface of the outer wall portion pressed against the electronic device by a fixing member in contact with the first surface of the outer wall portion.

Such a configuration enables the housing to be more firmly fixed.

A tenth aspect of the present invention provides the sealing member according to the ninth aspect, wherein the second surface of the outer wall portion includes a projection that extends to annularly surround a cable insertion direction that is a direction from the first opening toward the second opening and protrudes toward the inside of the electronic device.

With such a configuration, a space between the housing and the electronic device can be sealed by the projection.

An eleventh aspect of the present invention provides an electronic device that includes: the sealing member, according to any one of the first to tenth aspects, and the connector opening to which the sealing member is attached.

Such a configuration can provide the same effect as the sealing member according to the first aspect.

Hereinafter, an exemplary embodiment of a sealing member according to the present invention and an electronic device including the sealing member will be described with reference to the accompanying drawings. The present invention is not limited to the specific configuration in the following exemplary embodiment, and a configuration based on a similar technical concept is included in the present invention.

Exemplary Embodiment

A schematic configuration of a sealing member and an electronic device including the sealing member in an exemplary embodiment will be described with reference to FIGS. 1 to 3. FIG. 1 is an exploded perspective view of a periphery of connector opening 3A and sealing member 4 in electronic device 2 of the exemplary embodiment, FIG. 2 is a perspective view illustrating how sealing member 4 is attached to connector opening 3A and cable 8 is inserted, and FIG. 3 is a cross-sectional view of the same state as that of FIG. 2.

Figure 2:
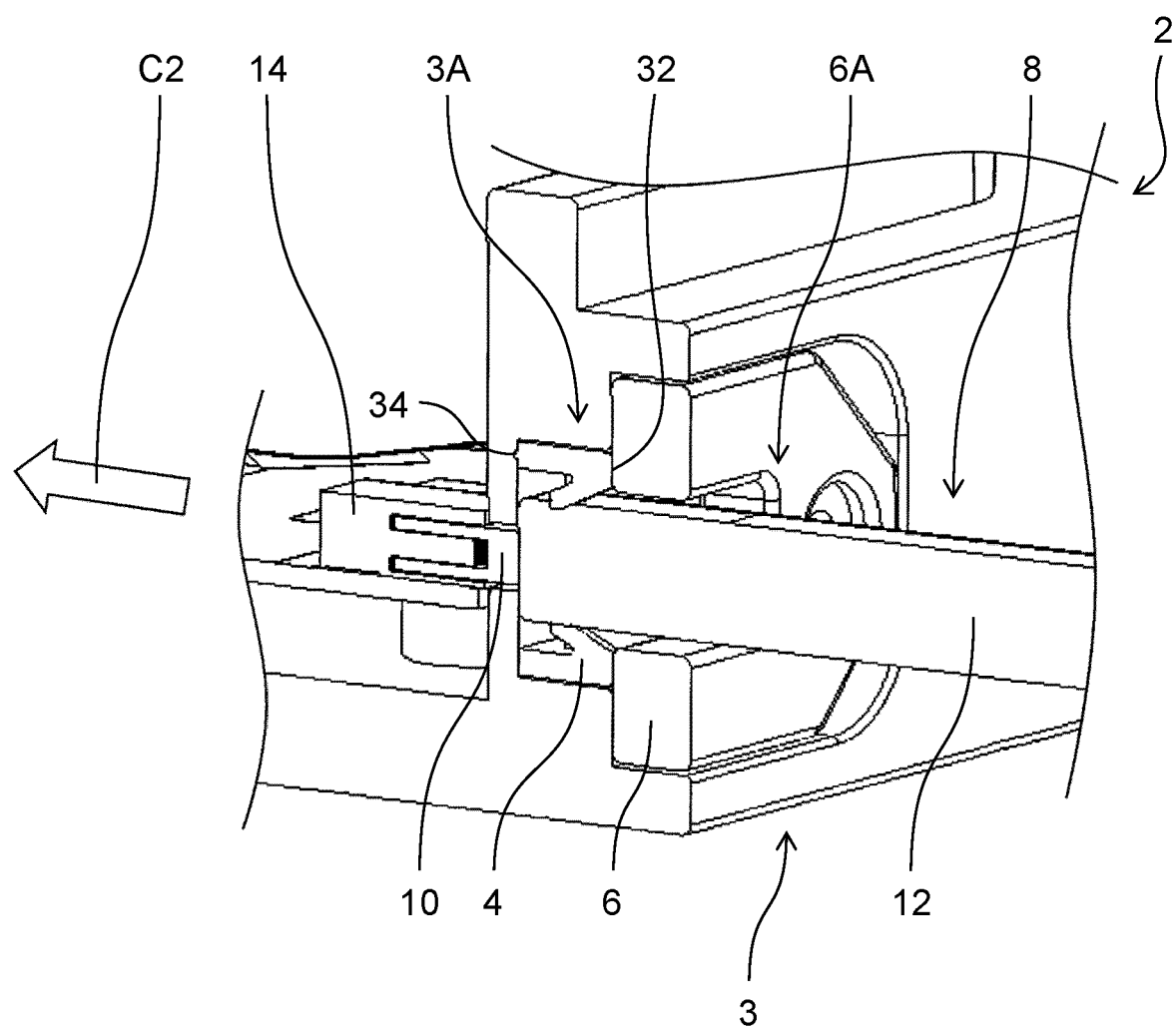
FIG. 2 is a perspective view illustrating how the sealing member is attached to the connector opening and a cable is inserted.
Figure 3:
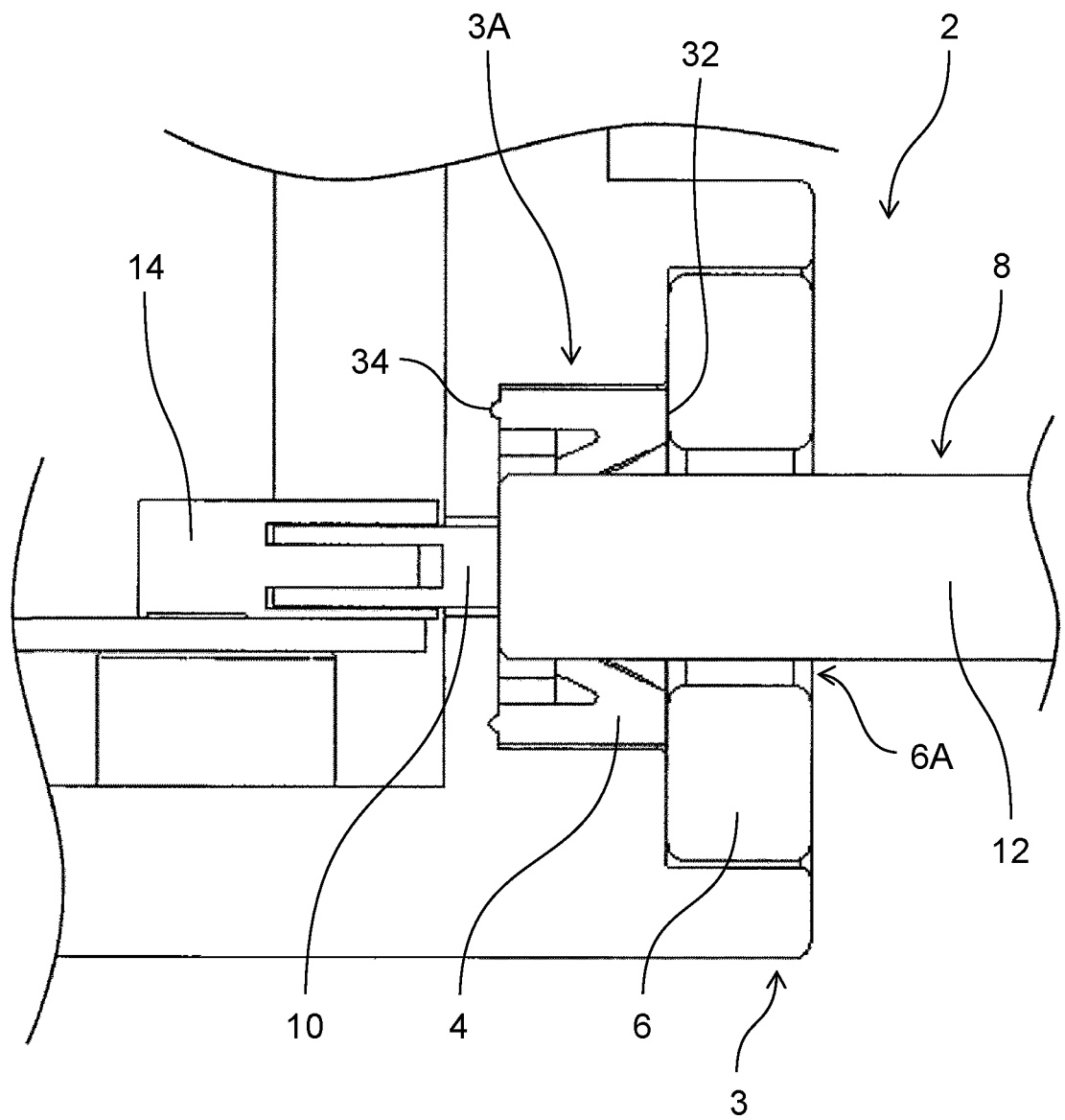
FIG. 3 is a cross-sectional view in the same state as FIG. 2.

Electronic device 2 shown in FIGS. 1 to 3 is an electronic device that allows cable 8 (FIGS. 2 and 3) to be electrically connected to electronic device body 3. Electronic device 2 is, for example, a laptop computer, and cable 8 is, for example, a USB cable.

As illustrated in FIG. 1, electronic device 2 includes electronic device body 3, sealing member 4, fixing member 6, and screws 7.

Electronic device body 3 is a part constituting a body of electronic device 2. Connector opening 3A is provided in a side surface of electronic device body 3. Connector opening 3A is an opening through which cable 8 is inserted to connect to electronic device body 3. Sealing member 4 for receiving cable 8 is attached to connector opening 3A.

Sealing member 4 is a member that seals between cable 8 inserted in connector opening 3A and electronic device body 3. As illustrated in FIGS. 2 and 3, sealing member 4 is fixed by fixing member 6 in a state where sealing member 4 is attached to connector opening 3A. A detailed configuration of sealing member 4 will be described later.

Fixing member 6 is a member that fixes sealing member 4 attached to connector opening 3A to connector opening 3A. Fixing member 6 has opening 6A at its central portion, and cable 8 can be inserted into opening 6A.

Screws 7 illustrated in FIG. 1 are members to fix fixing member 6 to connector opening 3A. Screws 7 are inserted into fixing member 6 and further into electronic device body 3.

Cable 8 illustrated in FIGS. 2 and 3 is inserted in fixing member 6 and sealing member 4 attached to connector opening 3A and is electrically connected to electronic device body 3.

Cable 8 includes terminal portion 10 and insulating cover 12. Terminal portion 10 is a conductive portion constituting a tip of cable 8 and is electrically connected to electronic device body 3. Insulating cover 12 is an insulating cover that covers a conductive portion such as terminal portion 10.

As illustrated in FIGS. 2 and 3, sealing member 4 comes into contact not with terminal portion 10 of cable 8 but with a periphery of insulating cover 12, so that sealing member 4 seals between insulating cover 12 and electronic device body 3. In this way, sealing member 4 exerts a waterproof function when cable 8 is connected to electronic device body 3.

The size (in particular, the diameter) of insulating cover 12 varies depending on a type of cable 8. Sealing member 4 of the present exemplary embodiment is configured to seal even when insulating cover 12 has various diameters, and will be described later in detail.

As illustrated in FIGS. 2 and 3, electronic device body 3 includes attaching portion 14. Attaching portion 14 is a portion that receives terminal portion 10 of cable 8. When terminal portion 10 is inserted in attaching portion 14, cable 8 and electronic device body 3 are electrically connected.

Figure 4:
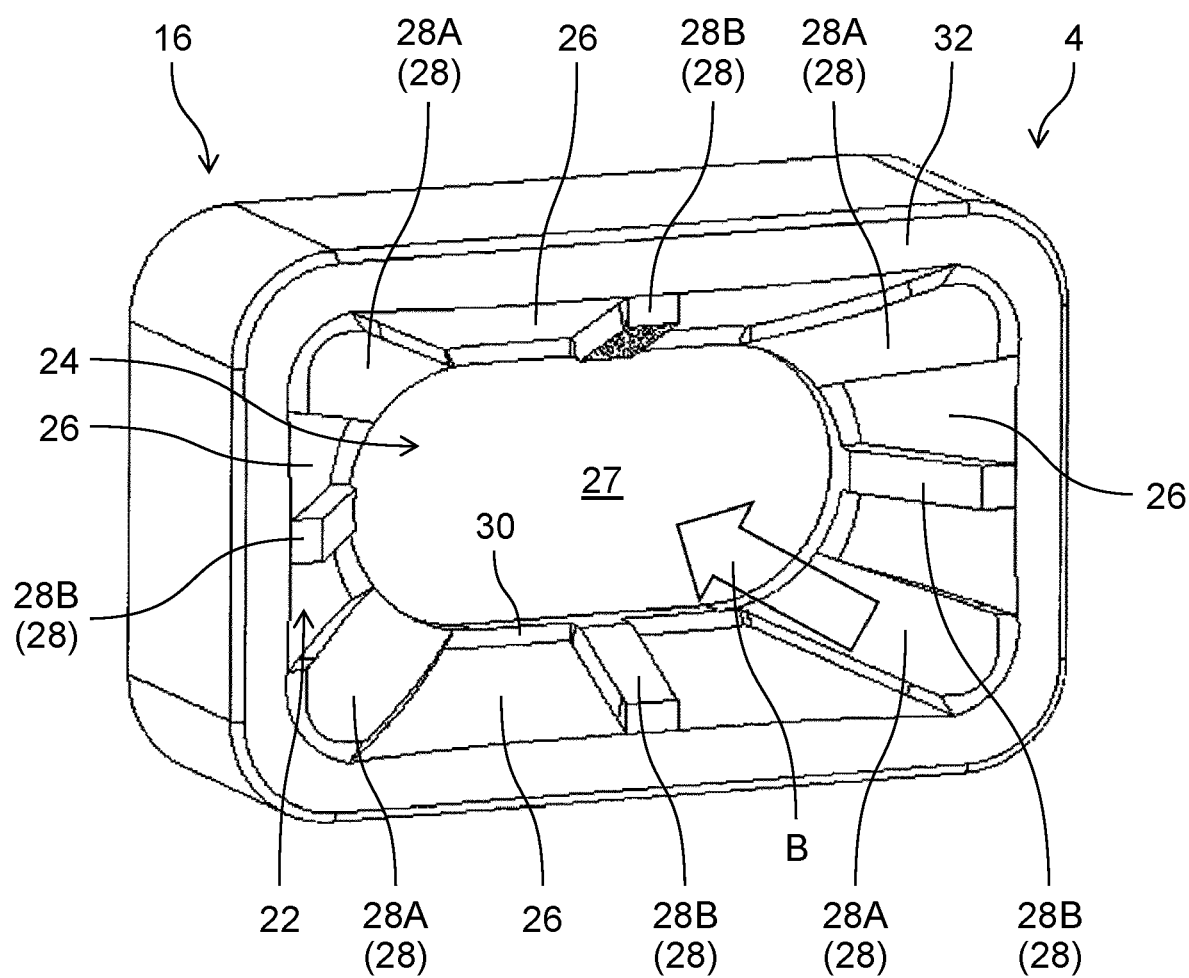
FIG. 4 is a perspective view of the sealing member.

Next, a configuration of sealing member 4 will be described with reference to FIGS. 4 to 6. FIG. 4 is a perspective view of sealing member 4, FIG. 5 is a front view of sealing member 4, and FIG. 6 is a cross-sectional view taken along line 6-6 in FIG. 5.

Figure 5:
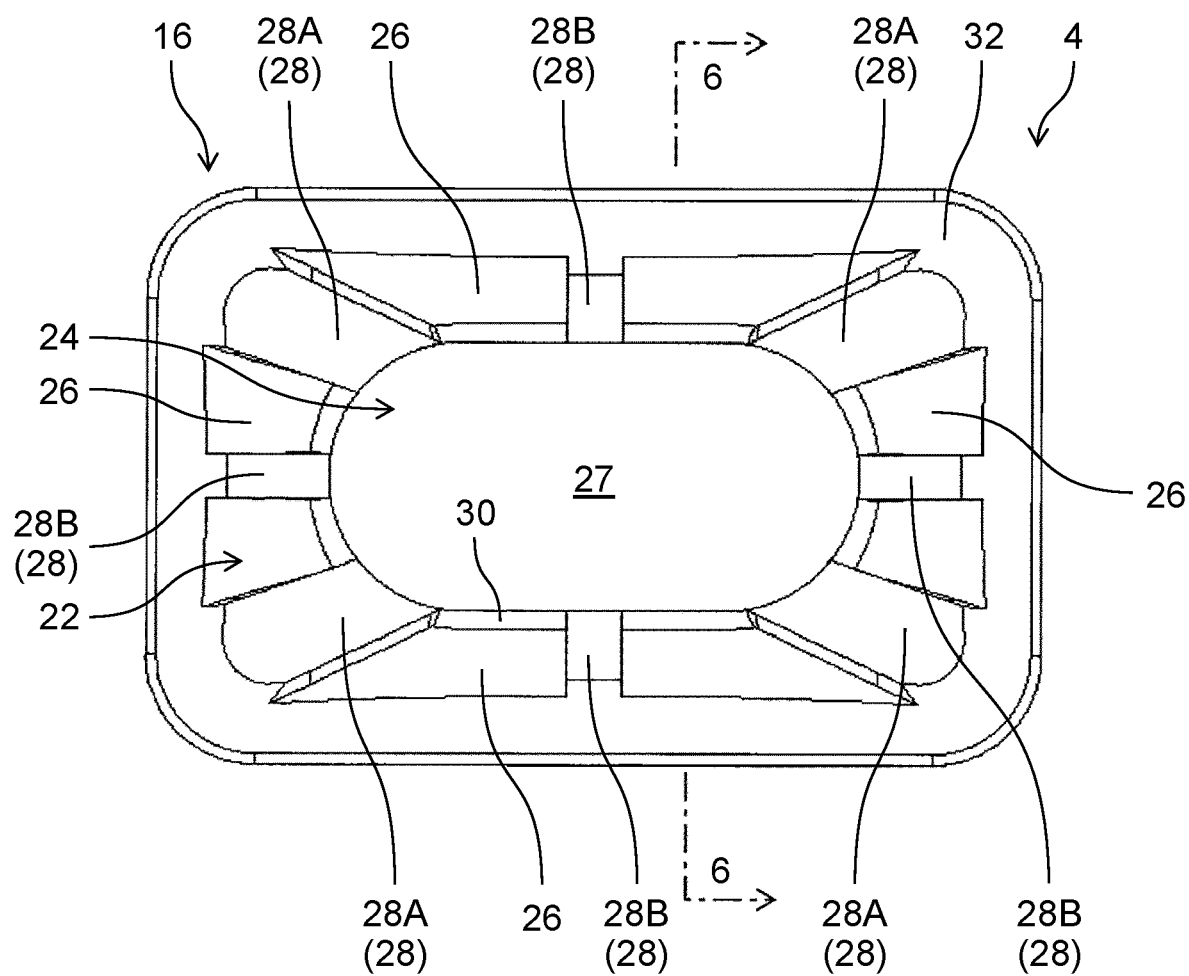
FIG. 5 is a front view of the sealing member.
Figure 6:
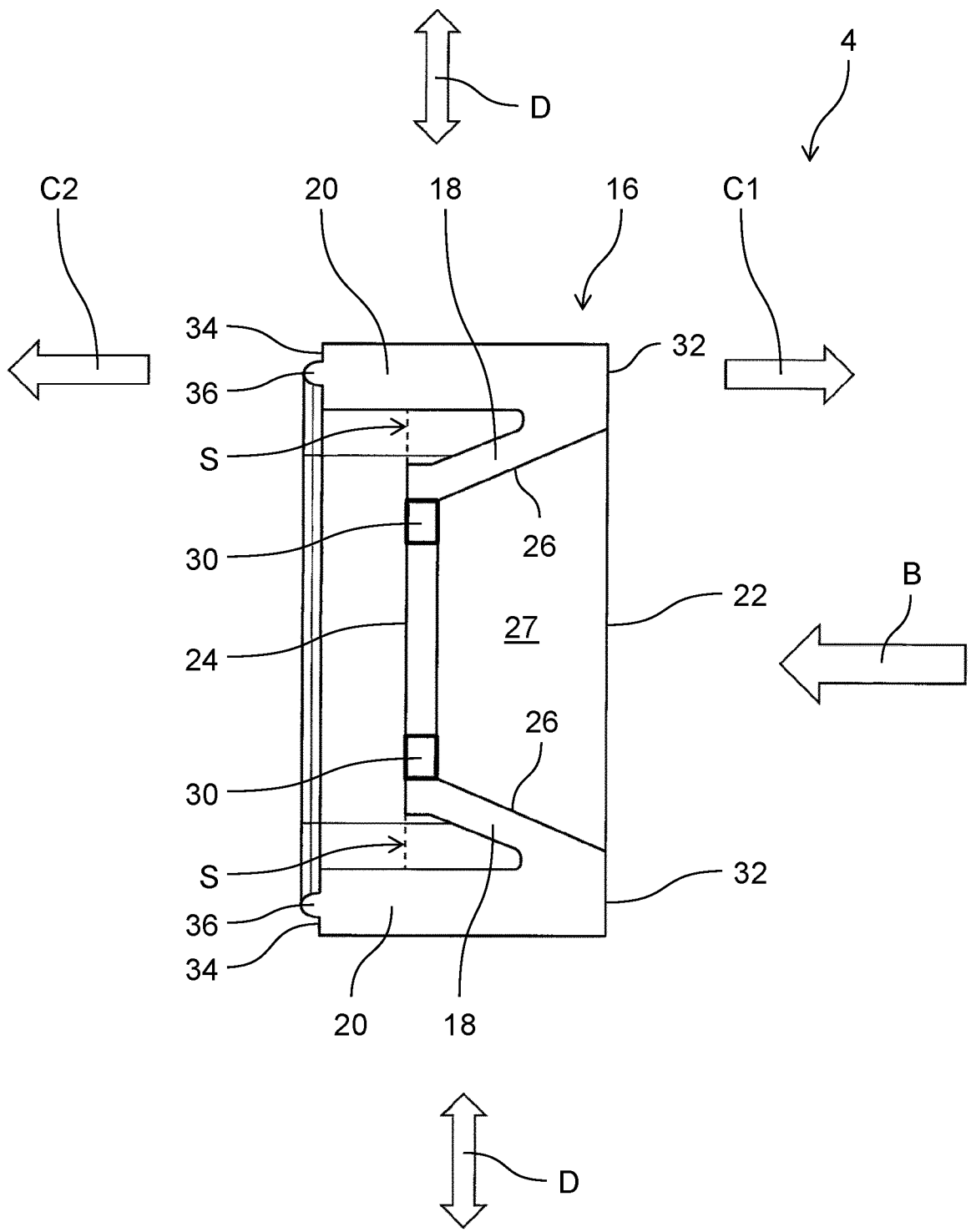
FIG. 6 is a cross-sectional view taken along line 6-6 in FIG. 5.

As illustrated in FIGS. 4 to 6, sealing member 4 includes housing 16 made of an elastic material. In the present exemplary embodiment, silicone rubber is used as the elastic material of sealing member 4. As illustrated in FIG. 6, housing 16 is roughly configured with two wall members. Specifically, housing 16 includes inner wall portion 18 and outer wall portion 20.

Inner wall portion 18 and outer wall portion 20 are wall members respectively disposed inside and outside. Inner wall portion 18 and outer wall portion 20 of the present exemplary embodiment are integrally configured. Inner wall portion 18 and outer wall portion 20 form a through-hole along cable insertion direction B in which cable 8 is inserted. A radial direction that is common to inner wall portion 18 and outer wall portion 20 is defined as D.

Inner wall portion 18 forms first opening 22 as an opening on an upstream side in cable insertion direction B. First opening 22 is an opening for cable 8 to be inserted therein and is also referred to as an "insertion opening". Inner wall portion 18 further forms second opening 24 as an opening on a downstream side. Second opening 24 is an opening for sealing cable 8 and is also referred to as a "sealing opening". As illustrated in FIGS. 4 to 6, a size of first opening 22 is set to be larger than a size of second opening 24. Specifically, as illustrated in FIG. 4, the whole body of first opening 22 overlaps second opening 24 when viewed from cable insertion direction B.

Inclined surface 26 is provided as an inner peripheral surface of inner wall portion 18. Inclined surface 26 is a surface that receives insulating cover 12 (FIGS. 2 and 3) of above-described cable 8. As illustrated in FIG. 6, inclined surface 26 is a surface having a tapered shape that is inclined and tapered inward from first opening 22 to second opening 24. Inclined surface 26 of the present exemplary embodiment is a curved surface continuously extending in cable insertion direction B.

A region surrounded by inclined surface 26 is referred to as insertion space 27. Insertion space 27 is a space extending in cable insertion direction B from first opening 22 to second opening 24. Insertion space 27 has a substantially truncated cone shape.

As illustrated in FIGS. 4 and 5, inclined surface 26 of housing 16 is provided with a plurality of ribs 28. Each of the plurality of ribs 28 is a protruding portion extending along cable insertion direction B. Each of the plurality of ribs 28 protrudes inward from inclined surface 26 toward insertion space 27.

Ribs 28 include, as two types of ribs, first ribs 28A and second ribs 28B. First ribs 28A are ribs provided upright at corner portions of inclined surface 26. Second ribs 28B are ribs provided upright at positions different from the corner portions of inclined surface 26, and are provided at substantially the centers of the four sides constituting inclined surface 26 in the present exemplary embodiment. First ribs 28A and second ribs 28B are regularly and alternately provided at intervals in a direction surrounding cable insertion direction B.

First ribs 28A are mainly provided to reinforce housing 16. Corner portions of inclined surface 26 on which first ribs 28A are provided upright are each a part where stress is likely to concentrate when cable 8 inserted from first opening 22 comes into contact with inclined surface 26 and is pressed outward, and breakage is likely to occur at the corner portions. By providing first rib 28A extending in cable insertion direction B at each corner portion of inclined surface 26, it is possible to suppress breakage of housing 16 and to effectively reinforce housing 16.

Second ribs 28B are provided mainly to perform positioning of cable 8. Specifically, when cable 8 inserted from first opening 22 travels along second ribs 28B provided at a total of four places on the left, right, top, and bottom, cable 8 is guided to a center position of insertion space 27 and centered. In this manner, second rib 28B can exert a positioning function on cable 8.

The whole of housing 16 including above-described ribs 28 is provided as an integrated member and is made of a single elastic material.

Figure 7:
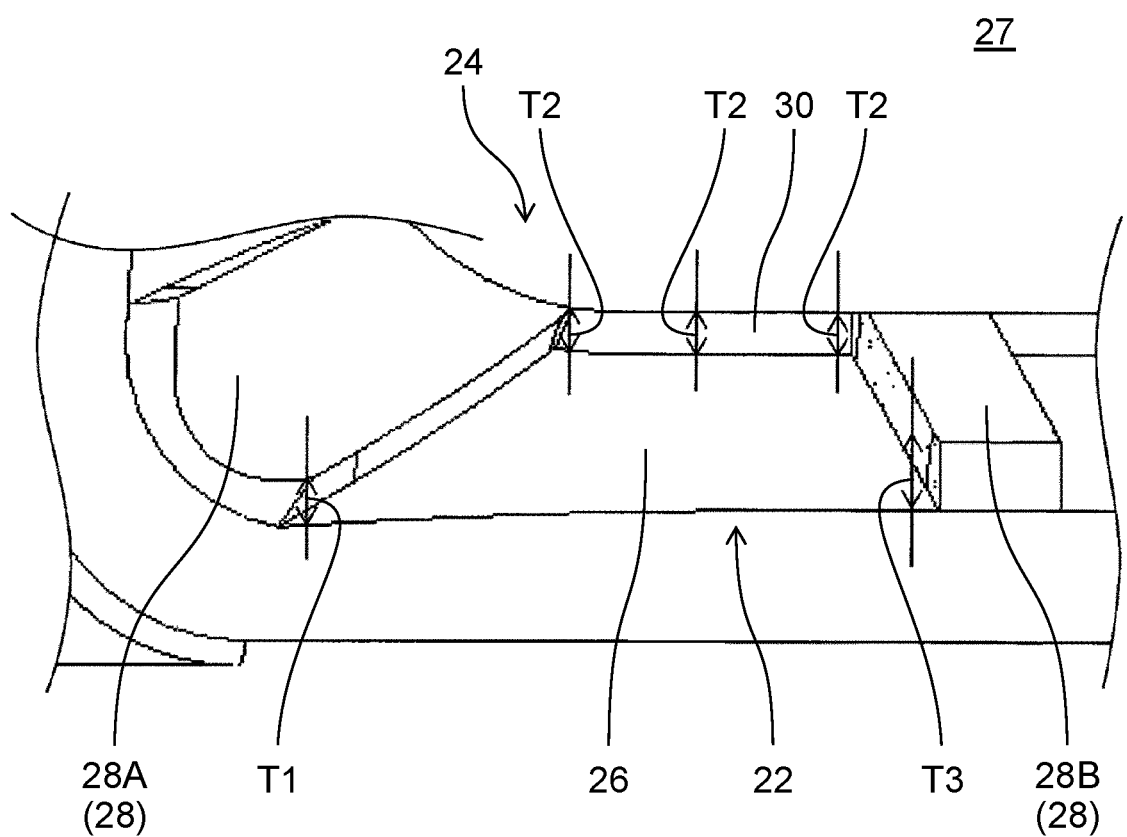
FIG. 7 is an enlarged perspective view of a part including a corner portion of an inclined surface.

Next, a relationship between thicknesses of first rib 28A and second rib 28B will be described with reference to FIG. 7. FIG. 7 is a partially enlarged perspective view of a part including one of the corner portions of inclined surface 26.

As illustrated in FIG. 7, the thickness of first rib 28A continuously changes from first opening 22 toward second opening 24. First rib 28A has thickness T1 at first opening 22 and thickness T2 at second opening 24. Similarly, second rib 28B has thickness T3 at first opening 22 and thickness T2 at second opening 24.

In the present exemplary embodiment, thickness T3 of second ribs 28B at first opening 22 is set to be larger than thickness T1 of first ribs 28A. Such a setting can cause second ribs 28B to preferentially exert a positioning function on cable 8.

On the other hand, at second opening 24, thickness T2 of first ribs 28A and thickness T2 of second ribs 28B are set to the same value.

As illustrated in FIG. 7, protruding portion 30 is formed on inclined surface 26. Protruding portion 30 is a portion protruding inward toward insertion space 27 from inclined surface 26. Protruding portion 30 annularly extends so as to surround second opening 24 (see FIGS. 4 and 5).

With reference again to FIG. 7, thickness T2 of protruding portion 30 is set to the same value as thickness T2 of first rib 28A and thickness T2 of second rib 28B at second opening 24. That is, protruding portion 30, first ribs 28A, and second ribs 28B are flush with each other at second opening 24. Such a configuration enables protruding portion 30 to be reliably brought into contact and to be in close contact with insulating cover 12 of cable 8 inserted in insertion space 27 and passing through second opening 24. As a result, it is possible to more accurately seal between insulating cover 12 and electronic device body 3.

In addition, protruding portion 30 of the present exemplary embodiment is disposed at a position constituting second opening 24, in other words, at a downstream end part of inclined surface 26 in cable insertion direction B. With such an arrangement, since protruding portion 30 is provided at second opening 24, which is the narrowest place in insertion space 27, insulating cover 12 of cable 8 can be strongly pressed against protruding portion 30. In addition, it is easier to design than in a case where protruding portion 30 is provided in the middle of inclined surface 26.

With reference again to FIG. 6, outer wall portion 20 has first surface 32 and second surface 34. In a state where sealing member 4 is attached to connector opening 3A, first surface 32 is disposed to be directed outside electronic device 2 (see arrow C1), and second surface 34 is disposed to be directed inside electronic device 2 (see arrow C2). First surface 32 may be referred to as a front surface of housing 16, and second surface 34 may be referred to as a rear surface of housing 16.

As shown in FIG. 6, while first surface 32 is formed to be a flat surface, second surface 34 is provided with projection 36. Projection 36 is a projection for sealing between sealing member 4 and electronic device body 3. Specifically, as illustrated in FIGS. 2 and 3, second surface 34 provided with projection 36 is in contact with electronic device body 3. At this time, fixing member 6 is in contact with first surface 32 of sealing member 4, and sealing member 4 is pressed toward the inside of electronic device 2 via first surface 32 (see arrow C2). Because second surface 34 provided with projection 36 is also pressed toward the inside of electronic device body 3, projection 36, which is an elastic material, can function as a sealing portion that seals between sealing member 4 and electronic device body 3.

Figure 8:
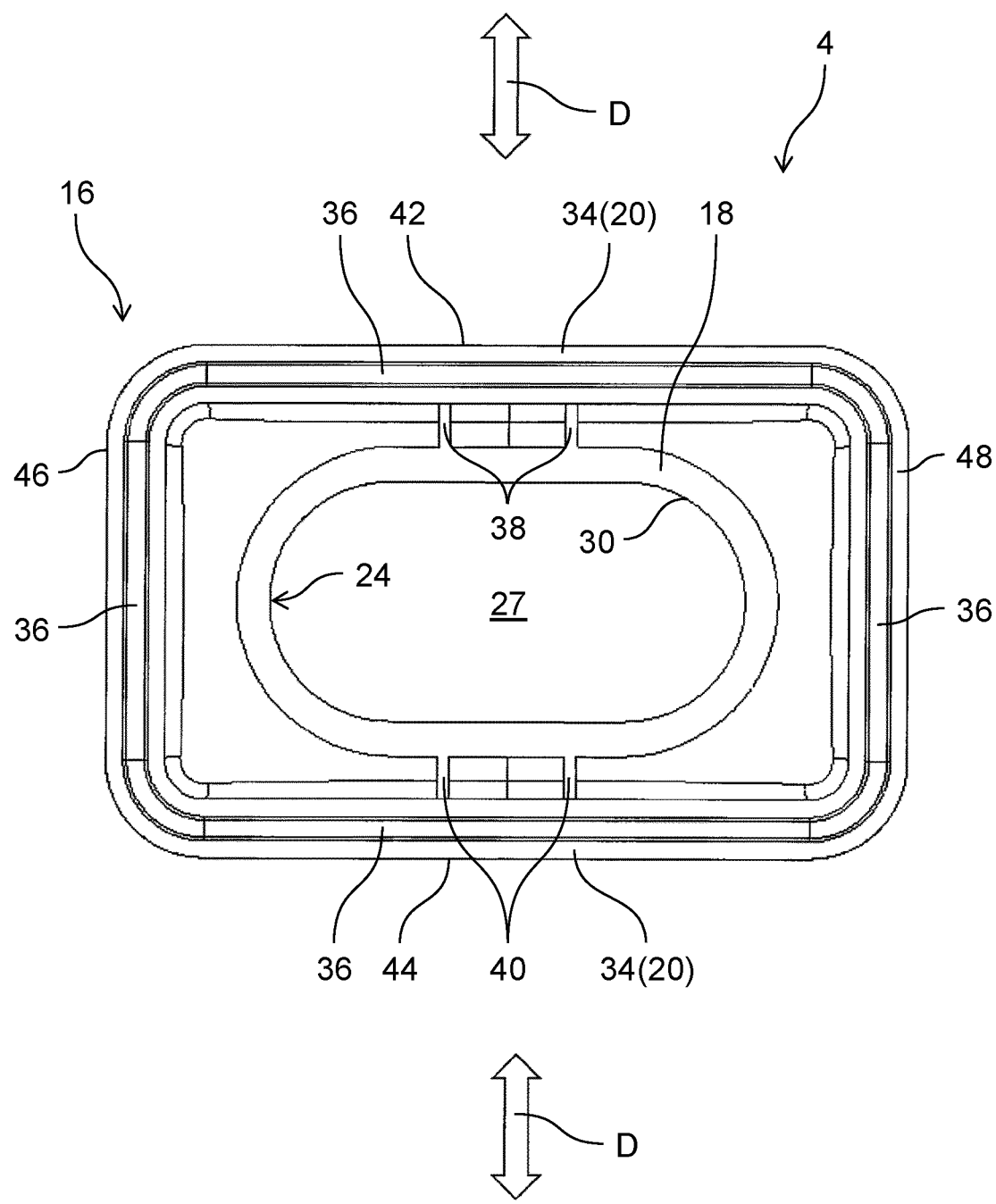
FIG. 8 is a rear view of the sealing member.

A configuration of sealing member 4 on the side of second surface 34, on which projection 36 is provided, will be described with reference to FIG. 8. FIG. 8 is a rear view of sealing member 4.

As illustrated in FIG. 8, projection 36 is formed in an annular shape so as to surround a periphery of insertion space 27. With this configuration, it is possible to more reliably seal between sealing member 4 and electronic device body 3.

As illustrated in FIG. 8, a plurality of connection ribs 38 and 40 are provided between inner wall portion 18 and outer wall portion 20. Connection ribs 38 and 40 are ribs partially connecting inner wall portion 18 and outer wall portion 20 in radial direction D.

Connection ribs 38 are provided in gap S on one side with respect to insertion space 27, and connection ribs 40 are provided in gap S on the other side with respect to insertion space 27 (positions symmetrical to connection ribs 38 with respect to insertion space 27). Connection ribs 38 and 40 are respectively provided at positions corresponding to a pair of long sides 42 and 44 of the four sides of sealing member 4. Since long sides 42 and 44 of sealing member 4 are longer than short sides 46 and 48 of sealing member 4, a stress generated by pressing of cable 8 is likely to vary, and the stress is likely to decrease particularly in the central parts. By providing connection ribs 38 and at positions corresponding to long sides 42 and 44 of sealing member 4, the stress generated by pressing of cable 8 can be effectively dispersed, and local breakage of housing 16 can be suppressed.

With reference again to FIG. 6, inner wall portion 18 and outer wall portion 20 are connected via first surface 32. That is, first surface 32 is a connection surface that connects inner wall portion 18 and outer wall portion 20. As illustrated in FIG. 6, gap S is formed between inner wall portion 18 and outer wall portion 20. Gap S is formed by disposing inner wall portion 18 and outer wall portion 20 with an interval in radial direction D. Since gap S is provided, it is possible to secure a space in which inner wall portion 18 is deformed even when cable 8 inserted into insertion space 27 presses inner wall portion 18 outward. This makes it possible to perform sealing while facilitating insertion of cable 8.

As illustrated in FIG. 6, outer wall portion 20 extends to a more downstream side than inner wall portion 18 in cable insertion direction B, in other words, to the deeper side (closer to electronic device body 3). Therefore, even when cable 8 inserted into insertion space 27 presses inner wall portion 18 toward the back side, a space in which inner wall portion 18 is deformed can be secured, and cable 8 can be easily inserted.

Sealing member 4 having the above-described configuration is configured to deal with cables 8 having various sizes. Here, a case where two different types of cables 8A, 8B are each inserted into sealing member 4 will be described with reference to FIGS. 9A, 9B, 10A, and 10B.

Figure 9A:
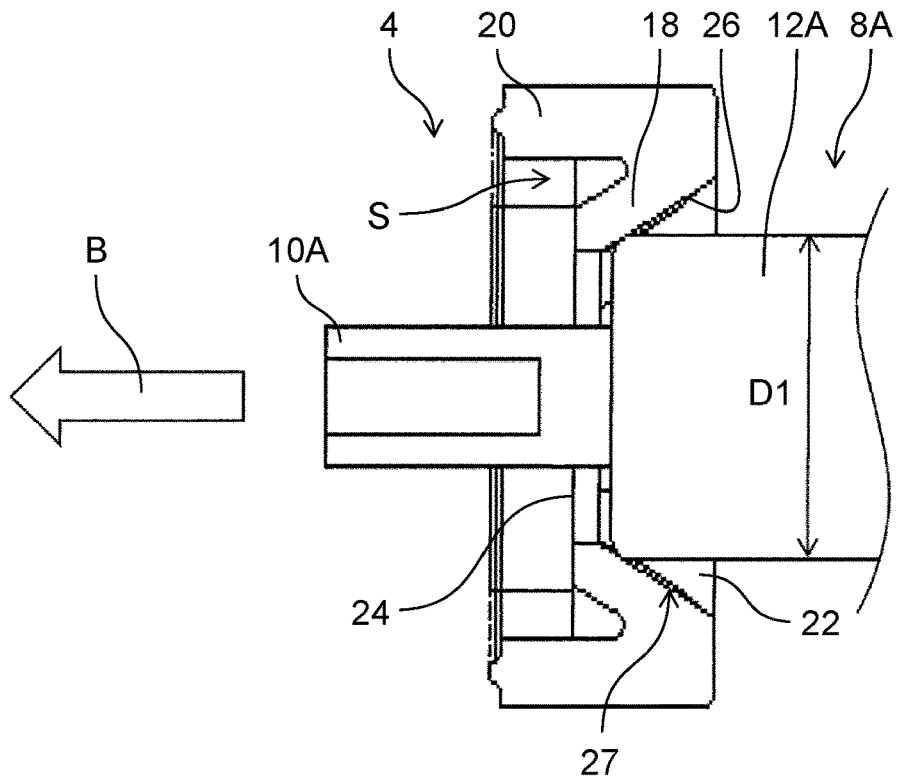
FIG. 9A is a cross-sectional view illustrating how a first type of cable is inserted in the sealing member.
Figure 9B:
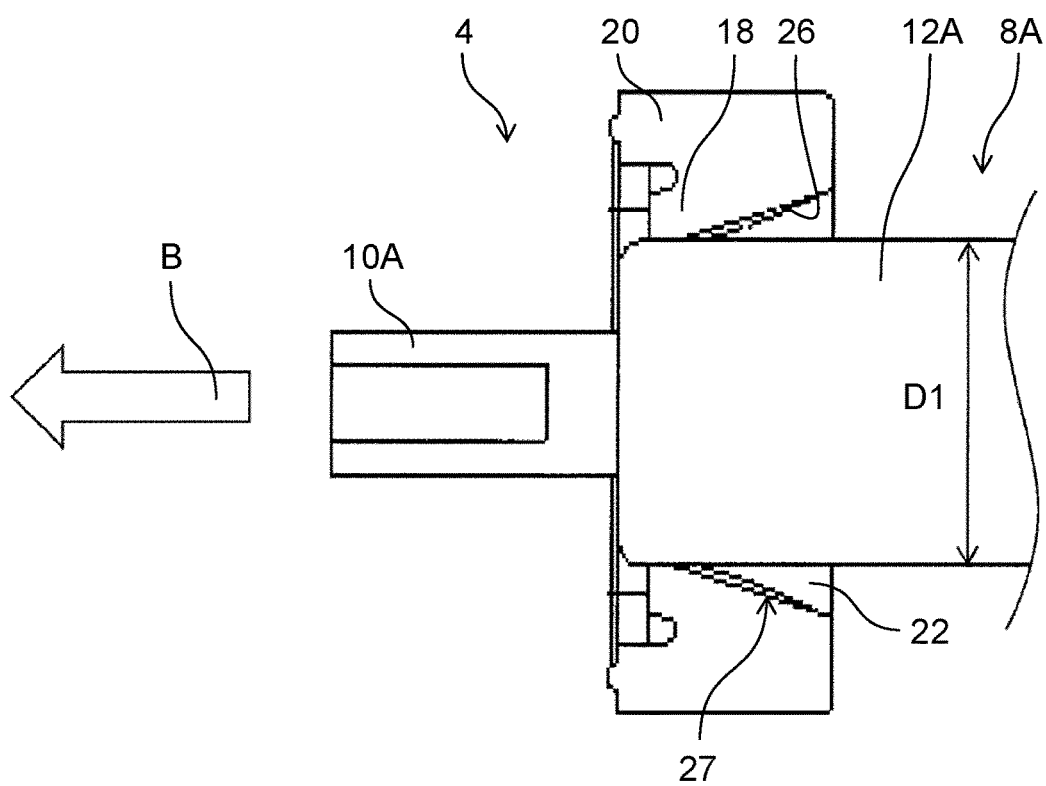
FIG. 9B is a cross-sectional view illustrating how the first type of cable is further inserted in the sealing member.
Figure 10A:
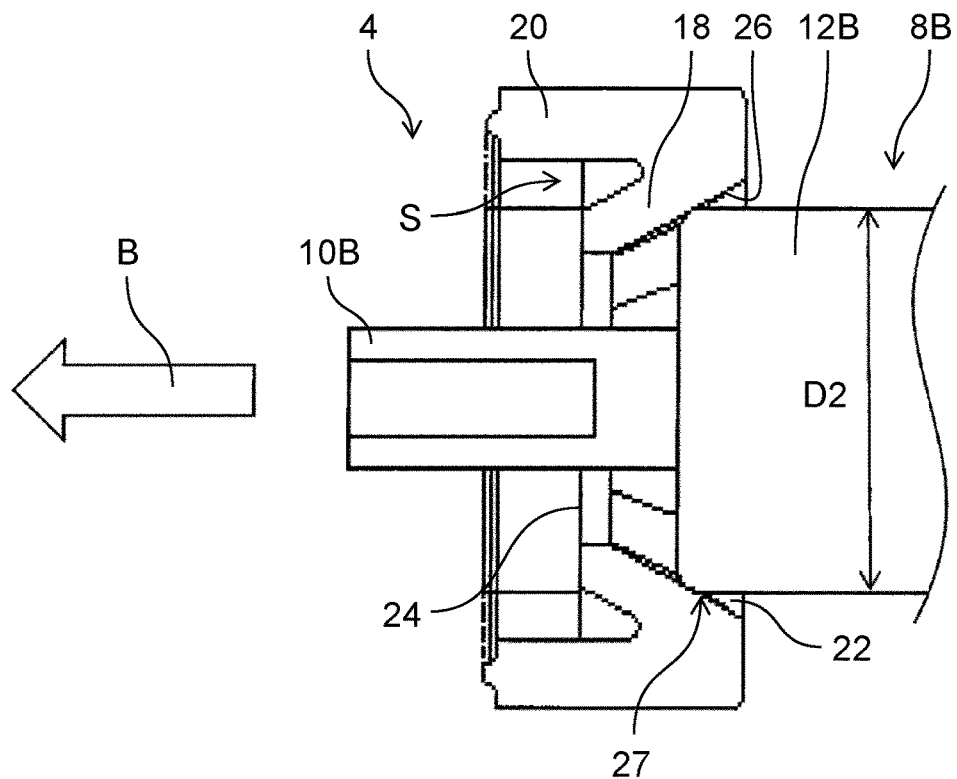
FIG. 10A is a cross-sectional view illustrating how a second type of cable is inserted in the sealing member.
Figure 10B:
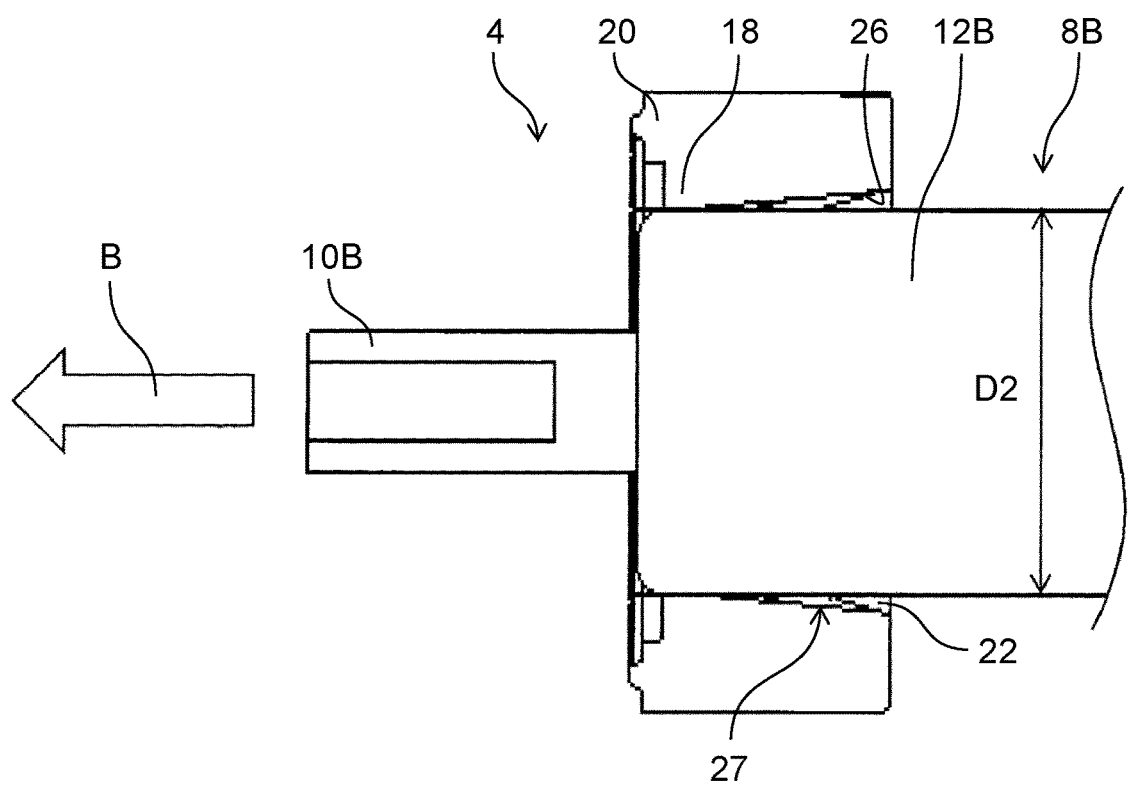
FIG. 10B is a cross-sectional view illustrating how the second type of cable is further inserted in the sealing member.

FIGS. 9A and 9B are views illustrating how a first type of cable 8A is inserted into sealing member 4, and FIGS. 10A and 10B are views illustrating how a second type of cable 8B is inserted into sealing member 4. In the present example, insulating cover 12A of the first type of cable 8A is smaller in diameter than insulating cover 12B of the second type of cable 8B. Specifically, diameter D1 of insulating cover 12A illustrated in FIGS. 9A and 9B is smaller than diameter D2 of insulating cover 12B illustrated in FIGS. 10A and 10B.

As illustrated in FIG. 9A, first type of cable 8A is inserted into insertion space 27 of sealing member 4 in cable insertion direction B. Since the size of first opening 22 is previously set to be larger than terminal portion 10A and diameter D1 of insulating cover 12A, insulating cover 12A can be inserted into insertion space 27 to come into contact with inclined surface 26. On the other hand, the size of second opening 24 is previously set to be larger than terminal portion 10A and smaller than diameter D1 of insulating cover 12A.

Inclined surface 26 has a tapered shape that is tapered inward toward the downstream side in cable insertion direction B, and sealing member 4 is entirely made of an elastic material. Therefore, when cable 8A is further inserted in cable insertion direction B as illustrated in FIG. 9B, insulating cover 12A presses inner wall portion 18 outward in radial direction D. Inner wall portion 18 gets deformed in a direction toward outer wall portion 20, and inner wall portion 18 and insulating cover 12A come in closer contact with each other as cable 8A is further inserted. Accordingly, a space between inner wall portion 18 and insulating cover 12A can be sealed, and sealing member 4 can exert a waterproof function.

As described above, gap S is provided between inner wall portion 18 and outer wall portion 20 that constitute sealing member 4. Therefore, as illustrated in FIG. 9B, even when inner wall portion 18 is pushed outward by insulating cover 12A, the space in which inner wall portion 18 is deformed is secured. As a result, the insertion of cable 8A can be prevented from being hindered, and cable 8A can be easily inserted.

As described above, outer wall portion 20 extends to the more downstream side than inner wall portion 18 in cable insertion direction B. Therefore, as illustrated in FIG. 9B, even when inner wall portion 18 is pushed in cable insertion direction B by insulating cover 12A, a space in which inner wall portion 18 is deformed in cable insertion direction B can be secured. As a result, the insertion of cable 8A can be prevented from being hindered, and cable 8A can be easily inserted.

Although not illustrated in FIG. 9A or 9B, the insertion of cable 8A can be guided by the plurality of ribs 28 described above. Specifically, the portions where stress is likely to concentrate in housing 16 are reinforced by first ribs 28A provided at the corner portions of inclined surface 26, and, at the same time, cable 8 can be positioned at the center position of insertion space 27 by second ribs 28B. Further, as described above, by making thickness T3 of second ribs 28B at first opening 22 larger than thickness T1 of first ribs 28A, a positioning effect to cable 8A by second ribs 28B can be preferentially exerted.

Further, since protruding portion 30 described above is provided at the position constituting second opening 24 on the most downstream side in cable insertion direction B, insulating cover 12A can be more strongly brought into close contact with protruding portion 30, and sealing can be performed more accurately.

As illustrated in FIG. 10A, second type of cable 8B is inserted into insertion space 27 of sealing member 4 in cable insertion direction B. Since the size of first opening 22 is previously set to be larger than terminal portion 10B and diameter D2 of insulating cover 12B, insulating cover 12B can be inserted into insertion space 27 to come into contact with inclined surface 26. On the other hand, the size of second opening 24 is previously set be larger than terminal portion 10B and smaller than diameter D2 of insulating cover 12B.

Similarly to cable 8A illustrated in FIGS. 9A and 9B, by further inserting cable 8B in cable insertion direction B as illustrated in FIG. 10B, the space between inner wall portion 18 and insulating cover 12B can be sealed, and sealing member 4 can exert a waterproof function.

Since sealing member 4 has the above-described configuration, even when the lengths of diameters D1 and D2 of insulating covers 12A, 12B are different, it is possible to seal between insulating covers 12A, 12B and electronic device body 3. Note that the sizes and shapes of first opening 22 and second opening 24 may be set in advance according to specifications of cables 8A, 8B and the like.

Figure 11:
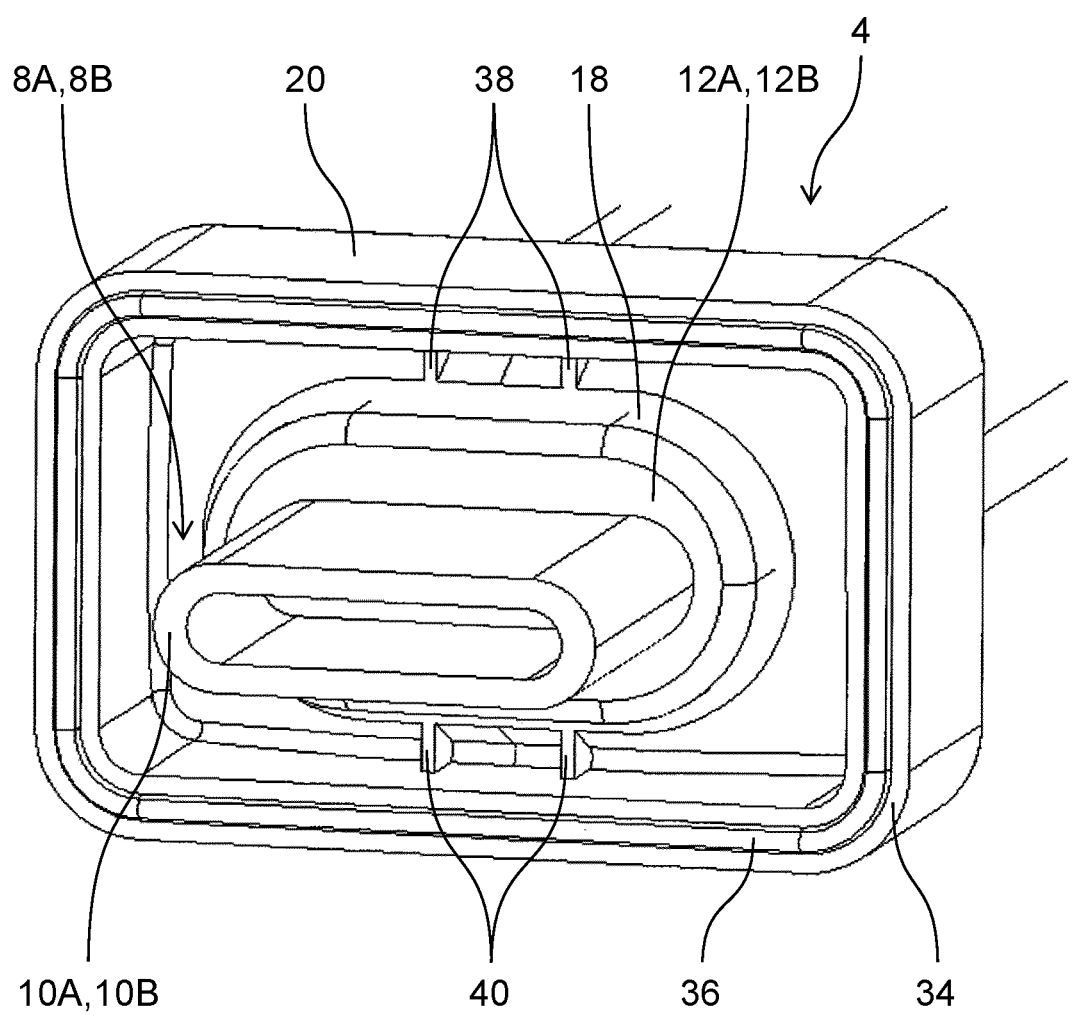
FIG. 11 is a rear side perspective view illustrating how the cable is inserted in the sealing member.

FIG. 11 is a rear side perspective view of the state where cable 8A, 8B is inserted into sealing member 4. As shown in FIG. 11, it can be seen that inner wall portion 18 of sealing member 4 is sealed in close contact with a periphery of insulating cover 12A, 12B of cable 8A, 8B.

Sealing member 4 of the present exemplary embodiment described above is a member that is attached to connector opening 3A for cable connection of electronic device 2 and seals between insulating cover 12 of cable 8 inserted in connector opening 3A and electronic device body 3. Sealing member 4 includes housing 16 made of an elastic material. Housing 16 forms first opening 22 and second opening 24 at a position facing first opening 22 and has inclined surface 26 having a tapered shape that is inclined and tapered inward from first opening 22 to second opening 24. In a state where sealing member 4 is attached to connector opening 3A, second opening 24 is disposed to an inside of electronic device 2 than first opening 22. Housing 16 includes inner wall portion 18 having inclined surface 26 formed inside thereof and outer wall portion 20 provided outside inner wall portion 18. Inner wall portion 18 and outer wall portion 20 are connected to each other around first opening 22, and gap S is formed between inner wall portion 18 and outer wall portion 20.

With such a configuration, cable 8 is inserted from first opening 22 toward second opening 24 while insulating cover 12 is being in contact with inclined surface 26 of inner wall portion 18, and a space between insulating cover 12 and electronic device body 3 can be sealed by housing 16. In addition, since gap S is provided between inner wall portion 18 and outer wall portion 20, even when cable 8 is inserted and inner wall portion 18 is pushed outward by cable 8, a space in which inner wall portion 18 is deformed can be secured. As a result, the insertion of cable 8 can be prevented from being hindered, and cable 8 can be easily inserted into sealing member 4.

In addition, electronic device 2 of the present exemplary embodiment includes connector opening 3A for cable connection and sealing member 4 attached to connector opening 3A. Such a configuration can provide the same effect as sealing member 4 described above.

Although the present invention has been described with reference to the above-described exemplary embodiment, the present invention is not limited to the above-described exemplary embodiment. For example, in the exemplary embodiment, the case where the plurality of ribs 28 are provided on inclined surface 26 has been described, but the present invention is not limited to such a case. For example, ribs 28 may not be provided on inclined surface 26, and entire inclined surface 26 may be a flat surface.

Although the present disclosure has been fully described in connection with a preferable exemplary embodiment with reference to the accompanying drawings, various modifications and corrections are obvious to those skilled in the art. It is to be understood that such changes and modifications are included within the scope of the present disclosure according to the appended claims unless such changes and modifications depart from the scope of the appended claims. In addition, the combination and order of elements in the exemplary embodiment can be changed without departing from the scope and ideas of the present disclosure.

Any exemplary embodiment or variation of the above various exemplary embodiments and variations may be appropriately combined to achieve effects of the exemplary embodiments and variations.

The present invention is applicable to any sealing member and any electronic device including the sealing member.

What is claimed is:

1. A sealing member attached to a connector opening of an electronic device to seal between an insulating cover of a cable inserted in the connector opening and a main body of the electronic device, the sealing member comprising a housing made of an elastic material, the housing including:
   a first opening;
   a second opening facing the first opening and located to an inside of the electronic device than the first opening; and
   an inclined surface having a tapered shape that is tapered inward from the first opening to the second opening;
   wherein the housing includes:
     an inner wall portion forming the inclined surface inside the inner wall portion;

an outer wall portion provided outside the inner wall portion; and a gap formed between the inner wall portion and the outer wall portion, the inner wall portion and the outer wall portion being connected to each other around the first opening;

wherein the inclined surface of the housing is provided with at least one rib extending along a cable insertion direction that is a direction from the first opening toward the second opening;

wherein the inclined surface of the housing has a corner portion extending along the cable insertion direction; and wherein the at least one rib includes a first rib provided upright at the corner portion of the inclined surface.

2. The sealing member according to claim 1, wherein the inclined surface of the housing has a corner portion extending along the cable insertion direction, and the at least one rib includes a second rib provided upright at a position different from the corner portion of the inclined surface.

3. The sealing member according to claim 1, wherein the inclined surface of the housing has a corner portion extending along the cable insertion direction, the at least one rib includes a plurality of ribs, each of the plurality of ribs includes:

a first rib provided upright at the corner portion of the inclined surface; and a second rib provided upright at a position different from the corner portion of the inclined surface, and a thickness of the second rib is larger than a thickness of the first rib at the first opening.

4. The sealing member according to claim 1, wherein the outer wall portion is disposed to extend to the inside of the electronic device than the inner wall portion.

5. An electronic device comprising:

the sealing member, according to claim 1; and the connector opening to which the sealing member is attached.

6. The sealing member according to claim 1, wherein the inclined surface of the housing includes a protruding portion extending to annularly surround a cable insertion direction that is a direction from the first opening toward the second opening, and the protruding portion is provided flush with the at least one rib.

7. The sealing member according to claim 6, wherein the protruding portion constitutes the second opening.

8. The sealing member according to claim 1, wherein the outer wall portion has:

a first surface that is a surface directed to an outside of the electronic device and is continuous with the inner wall portion around the first opening: and a second surface that is directed to the inside of the electronic device at a position facing the first surface, and the housing is fixed to the connector opening with the second surface of the outer wall portion pressed against the electronic device by a fixing member in contact with the first surface of the outer wall portion.

9. The sealing member according to claim 8, wherein the second surface of the outer wall portion includes a projection that extends to annularly surround a cable insertion direction that is a direction from the first opening toward the second opening and protrudes toward the inside of the electronic device.

* * * * *